(12) United States Patent
Khoury et al.

(10) Patent No.: US 6,334,230 B1
(45) Date of Patent: Jan. 1, 2002

(54) WAFER CLEANING APPARATUS

(75) Inventors: Raymond M. Khoury, Wappingers Falls; Marc Mattaroccia, Rochester; Jose M. Ocasio, Maybrook, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/758,989

(22) Filed: Jan. 12, 2001

(51) Int. Cl.⁷ .......................... B08B 11/02; A46B 13/02
(52) U.S. Cl. ................. 15/77; 15/88.2; 15/102
(58) Field of Search .......................... 15/77, 88.2, 88.3, 15/21.1, 102

(56) References Cited

U.S. PATENT DOCUMENTS 5,901,399 A * 5/1999 Moinpour et al. ............ 15/102
5,911,257 A * 6/1999 Morikawa et al. ............ 15/102
5,937,469 A 8/1999 Culkins et al.
5,976,267 A 11/1999 Culkins et al.

FOREIGN PATENT DOCUMENTS

JP 11097397 4/1999

* cited by examiner

Primary Examiner—Randall E. Chin
(74) Attorney, Agent, or Firm—Jay H. Anderson

(57) ABSTRACT

A wafer cleaning apparatus includes a wafer holding mechanism and a wafer cleaning head; the mechanism contacts the outer edge of the wafer and has a surface substantially flush with the wafer surface. The wafer cleaning head includes a wafer cleaning element, which has a flat surface contacting the wafer surface when cleaning the wafer. The wafer cleaning element may be a brush, a sponge, or other suitable material. A portion of the wafer cleaning element overlies the above-mentioned surface of the wafer holding mechanism when cleaning the edge portion of the wafer. The wafer holding mechanism and wafer cleaning head are shaped to avoid mechanical interference therebetween when the edge portion of the wafer is cleaned. Accordingly, the entire wafer surface, including the area adjacent the edge, may be effectively cleaned.

5 Claims, 3 Drawing Sheets

WAFER CLEANING APPARATUS

FIELD OF THE INVENTION

This invention relates to semiconductor processing, and more particularly to an improved apparatus for cleaning semiconductor wafers.

BACKGROUND OF THE INVENTION

Wafer cleaning is an essential process in the manufacture of semiconductor devices. A number of other processes (notably chemical-mechanical polishing or CMP) leave residues on the wafer surface; such residues must be removed as completely as possible before further processing can be performed.

Two broad categories of wafer cleaning apparatus may be characterized as "roller-type" and "pencil-type." A typical roller-type wafer cleaning apparatus (shown, for example, in U.S. Pat. Nos. 5,937,469 and 5,976,267) includes a roller with a brush parallel to the wafer surface and extending across the wafer; the roller turns on its axis while the wafer rotates underneath it. A pencil-type cleaning apparatus, on the other hand, has a cleaning head mounted on a shaft which is perpendicular to the wafer surface and can move radially across the surface.

A typical pencil-type wafer cleaner is shown schematically in FIG. 1. The wafer 1, only the outer portion of which is shown, is mounted in a wafer chuck 2. The wafer chuck is generally connected to a shaft (not shown) for spinning the wafer at high speed, in order to facilitate rapid and thorough drying of the wafer. While the details of the wafer chuck design vary between cleaning tools, it should be noted that there is in general a portion 2a of the wafer chuck above the plane of the wafer surface being cleaned.

The pencil-type wafer cleaner 10 includes a cleaning head 11 connected to a shaft 12. The portion 11a of the cleaning head in contact with the wafer is approximately hemispherical in shape. This portion, at least, has a brush, sponge or the like for removing foreign material from the wafer surface. Shaft 12 is connected to a mechanism (not shown) which moves the wafer cleaner 10 in the radial direction. The wafer is thus efficiently cleaned as the cleaning head moves radially across the surface of the spinning wafer.

However, as shown in FIG. 1, the arrangement of head 11 and wafer chuck 2 can prevent the complete cleaning of the wafer. Mechanical interference between the cleaning head 11 and the wafer chuck 2 (at contact point 2c shown in FIG. 1) results in the point of cleaning contact 11p lying some radial distance inward from the edge of the wafer. An annular uncleaned region 1e thus remains near the edge of the wafer. This problem is commonly termed "edge exclusion."

It is possible to rotate the wafer by using rollers engaging the edge of the wafer; these rollers leave most of the area exposed, so that the cleaning head 11 may move unimpeded to the wafer edge (see U.S. Pat. No. 5,937,469 and Japanese patent publication JP 11-97397). However, such wafer edge rollers generally cannot spin the wafer at a high speed as is required for fast drying.

There remains a need for a pencil-type wafer cleaner which permits center-to-edge and edge-to-edge cleaning without edge exclusion, and which is compatible with a variety of wafer chuck arrangements.

SUMMARY OF THE INVENTION

The present invention addresses the above-described need by providing an apparatus for cleaning a surface of a wafer without edge exclusion. The apparatus includes a wafer holding mechanism with a portion contacting the outer edge of the wafer and having a surface substantially planar with the wafer surface. The apparatus further includes a wafer cleaning head including a wafer cleaning element; the wafer cleaning element has a flat surface contacting the wafer surface when cleaning the wafer. A portion of the wafer cleaning element overlies the above-mentioned surface of the wafer holding mechanism when cleaning the edge portion of the wafer. The wafer holding mechanism and wafer cleaning head are shaped to avoid mechanical interference therebetween when the edge portion of the wafer is cleaned.

The wafer cleaning element may be a brush, a sponge, or other suitable material.

As part of a pencil-type wafer cleaner, the apparatus also includes a shaft connected to the wafer cleaning head, the axis of the shaft being substantially perpendicular to the wafer surface.

DETAILED DESCRIPTION OF THE PREFERRED EMBODIMENT

Figure 1:
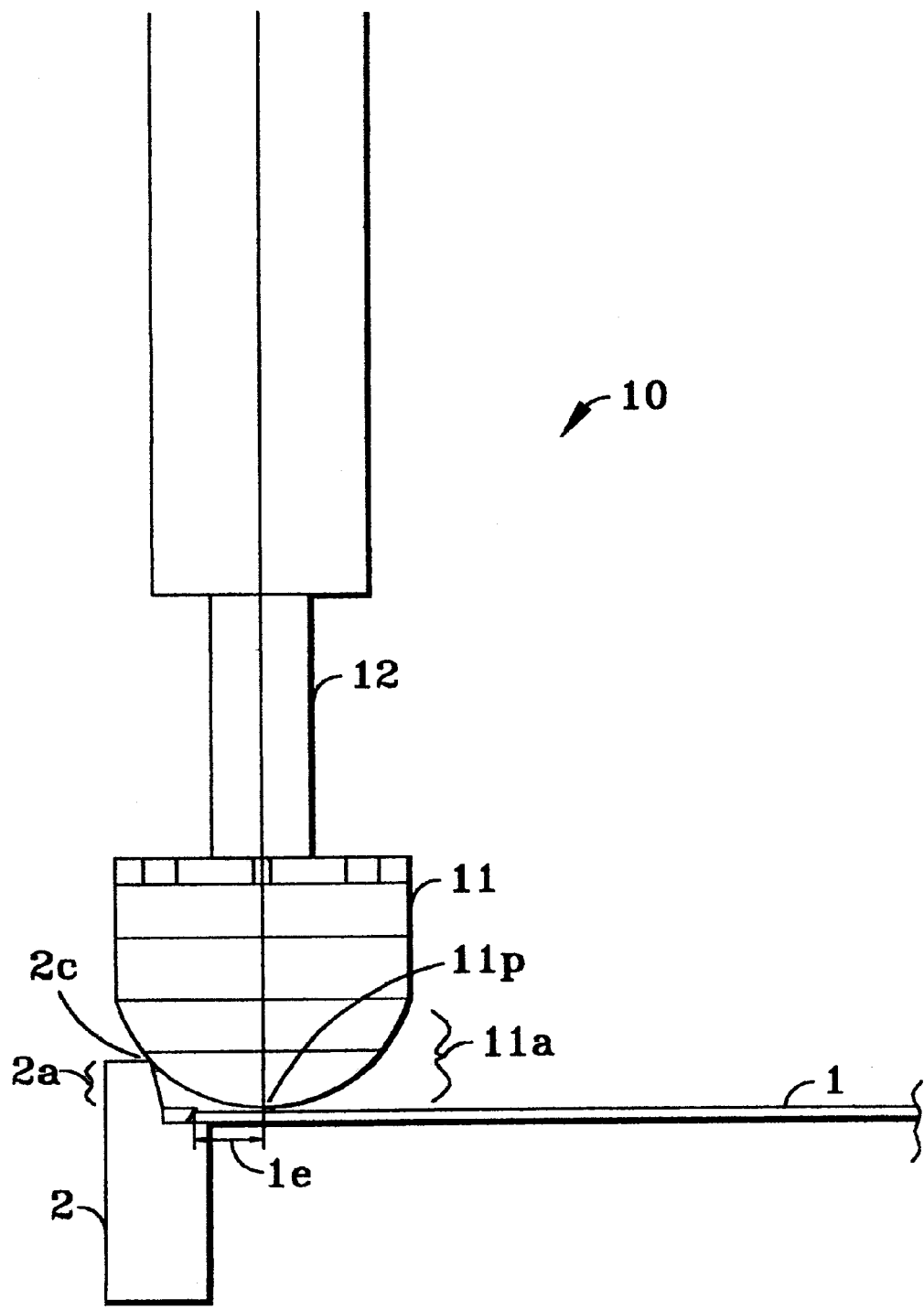
FIG. 1 is a schematic view of a typical pencil-type wafer cleaner, illustrating the problem of edge exclusion.
Figure 2:
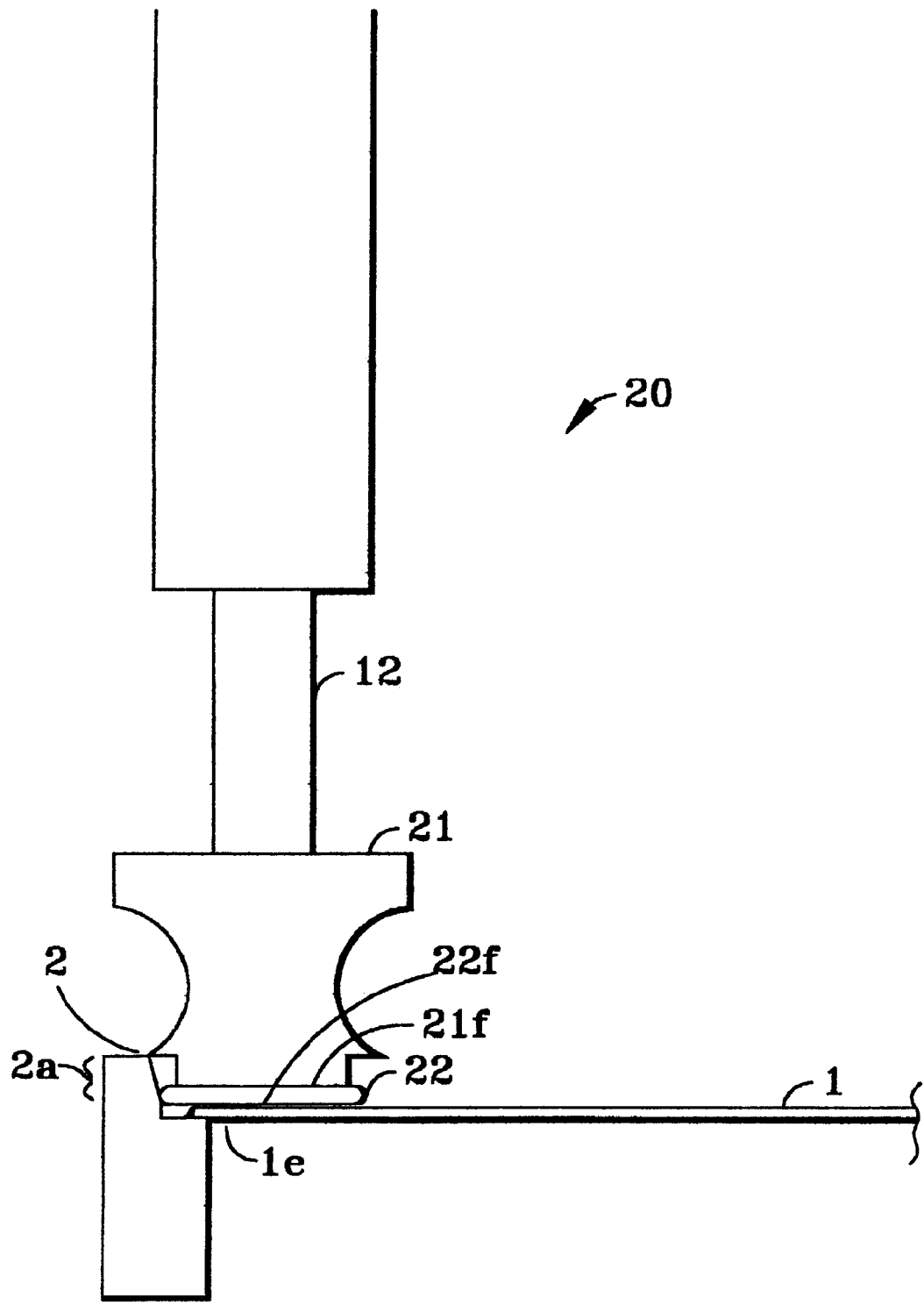
FIG. 2 shows an embodiment of a pencil-type wafer cleaner, in accordance with the present invention.

An embodiment of the present invention is shown in FIG. 2. In wafer cleaner 20, wafer cleaning head 21 (located above the surface of wafer 1) is attached to shaft 12; a cleaning element 22 is attached to the bottom of head 21. Cleaning head 21 is shaped (for example, an inverted cone shape, or concave as in FIG. 2) to avoid interference with the portion 2a of wafer chuck 2 projecting above the plane of the wafer surface. The bottom of head 21 is a flat surface 21f parallel to the wafer surface. Cleaning element 22 is preferably a sponge, but may be a brush or other suitable material. The cleaning element is disk-shaped, i.e. round and flat, with its flat bottom side 22f contacting the wafer surface. In contrast to the conventional cleaning head 11, the cleaning element of the present invention contacts the wafer evenly over a round area (with a diameter essentially that of cleaning element 22), as opposed to contacting the wafer at a single point 11p.

In operation, the wafer chuck 2 spins the wafer while the cleaning head 21 travels across the wafer, either edge-to-edge or center-to-edge.

Figure 3:
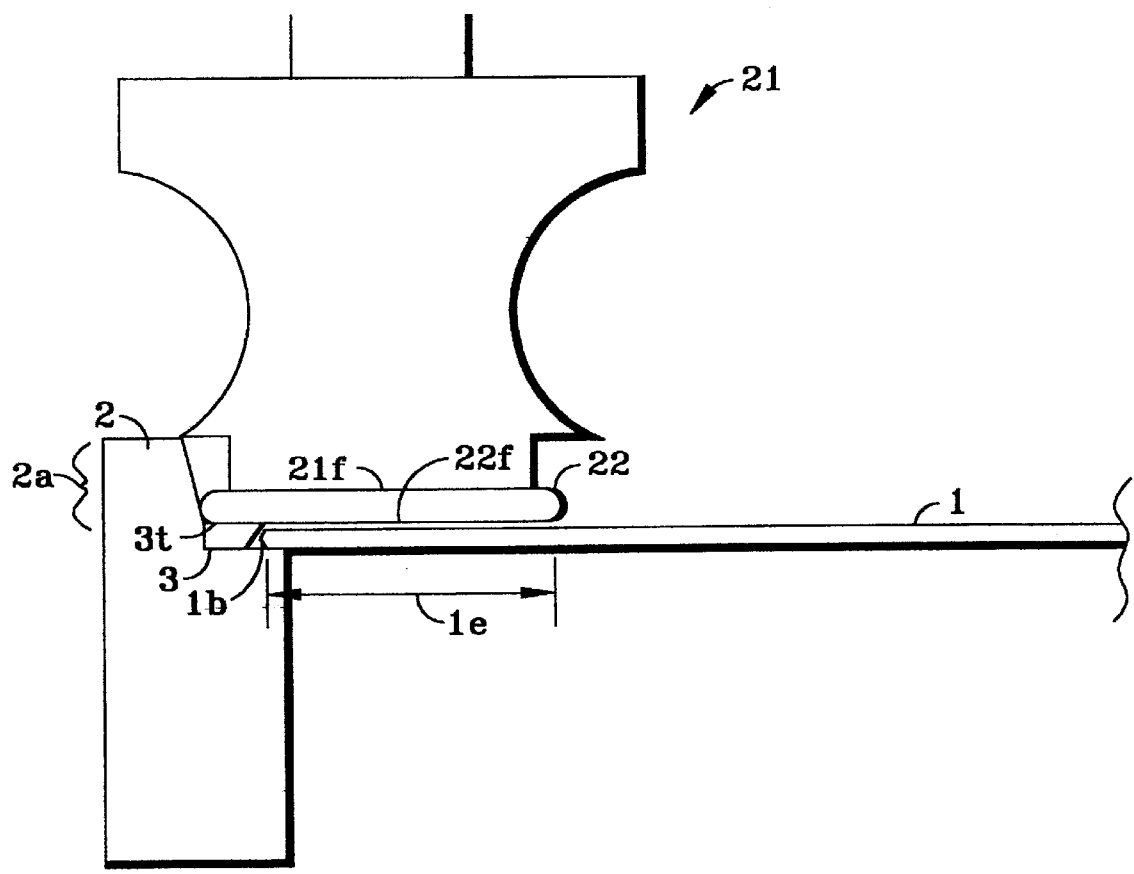
FIG. 3 is a detail view of FIG. 2, showing the wafer cleaning head in the wafer cleaner of the present invention.

As shown in detail in FIG. 3, the edge of wafer 1 is held by wafer chuck 2; in particular, an edge clamping portion 3 of the wafer chuck captures the beveled edge 1b of the wafer. It should be noted that edge clamping portion 3 has a flat top surface 3t which is substantially flush with the wafer surface. This permits cleaning element 22 to partially overlie clamping portion 3 when cleaning is performed at the edge of the wafer. As shown in FIG. 3, cleaning element 22 may contact the edge region 1e of the wafer, and indeed extend radially beyond the wafer edge, without the head 21 or cleaning element 22 encountering mechanical interference from the wafer chuck 2 or edge clamping portion 3. Accordingly, the edge region 1e is effectively cleaned, so that cleaning of the entire wafer surface may be performed.

While the invention has been described in terms of a specific embodiment, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. An apparatus for cleaning a surface of a wafer, the wafer having an outer edge and an annular edge portion of the surface adjacent the outer edge, the apparatus comprising:

a wafer holding mechanism including a portion contacting the outer edge of the wafer and having a surface substantially planar with the wafer surface; and a wafer cleaning head including a wafer cleaning element, the wafer cleaning element having a flat surface contacting the wafer surface when cleaning the wafer, a portion of the wafer cleaning element overlying said surface of the wafer holding mechanism when cleaning the edge portion of the wafer, wherein said wafer holding mechanism and said wafer cleaning head are shaped to avoid mechanical interference therebetween when the edge portion of the wafer is cleaned.

2. An apparatus according to claim 1, further comprising a shaft connected to said wafer cleaning head, the axis of said shaft being substantially perpendicular to the wafer surface.

3. An apparatus according to claim 1, wherein the wafer cleaning element is of a sponge material.

4. An apparatus according to claim 1, wherein the wafer cleaning element comprises a brush.

5. An apparatus according to claim 1, wherein the wafer cleaning element has a disk shape.

* * * * *